(12) United States Patent
Sukeda et al.

(10) Patent No.: US 11,492,226 B2
(45) Date of Patent: Nov. 8, 2022

(54) METHOD OF TRANSPORTING MEMBERS AND CONVEYING APPARATUS

(71) Applicant: TOYOTA JIDOSHA KABUSHIKI KAISHA, Toyota (JP)

(72) Inventors: Takuya Sukeda, Toyota (JP); Naoki Hirai, Miyoshi (JP); Akinori Tomioka, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 37 days.

(21) Appl. No.: 17/331,039

(22) Filed: May 26, 2021

(65) Prior Publication Data

US 2022/0002108 A1 Jan. 6, 2022

(30) Foreign Application Priority Data

Jul. 6, 2020 (JP) .............................. JP2020-116128

(51) Int. Cl.
*B65H 29/18* (2006.01)
*B65G 15/58* (2006.01)
*B21D 43/20* (2006.01)
*H01L 21/677* (2006.01)

(52) U.S. Cl.
CPC ............. *B65H 29/18* (2013.01); *B65G 15/58* (2013.01); *B21D 43/20* (2013.01); *B65H 2301/4212* (2013.01); *B65H 2404/283* (2013.01); *B65H 2515/70* (2013.01); *B65H 2701/173* (2013.01); *H01L 21/67706* (2013.01); *H01L 21/67709* (2013.01)

(58) Field of Classification Search
CPC ................ B65H 29/18; B65H 2515/70; B65H 2404/283; B65H 2701/173; B65H 3/16; B65H 29/30; B65G 15/58; B65G 47/34; B65G 21/2018; B65G 57/04; B65G 47/92; H01L 21/67709; Y10S 271/901; B03C 1/18
See application file for complete search history.

(56) References Cited

U.S. PATENT DOCUMENTS

| 3,795,301 A | * | 3/1974 | Sugitani | ................. | B65G 39/08 |
| | | | | | 198/690.1 |
| 7,281,710 B2 | * | 10/2007 | Okazaki | ................. | B65H 29/30 |
| | | | | | 271/193 |
| 2005/0189703 A1 | | 9/2005 | Okazaki et al. | | |

FOREIGN PATENT DOCUMENTS

JP 2005-179031 A 7/2005

\* cited by examiner

*Primary Examiner* — Jeremy R Severson
(74) *Attorney, Agent, or Firm* — Sughrue Mion, PLLC

(57) ABSTRACT

A method of transporting a plurality of sheet-like members containing a magnetic material includes a first step of placing one of the members on an endless belt, and a second step of releasing the member from a portion of the endless belt which is moved and folded back along a roller. The endless belt includes a first magnetic force generating portion that generates first magnetic force, and a second magnetic force generating portion that generates second magnetic force that is stronger than the first magnetic force. In the first step, the member is placed on the belt, such that a first portion of the member containing the magnetic material is located in the first magnetic force generating portion, and a second portion of the member containing the magnetic material and located rearward of the first portion in a conveying direction is located in the second magnetic force generating portion.

4 Claims, 11 Drawing Sheets

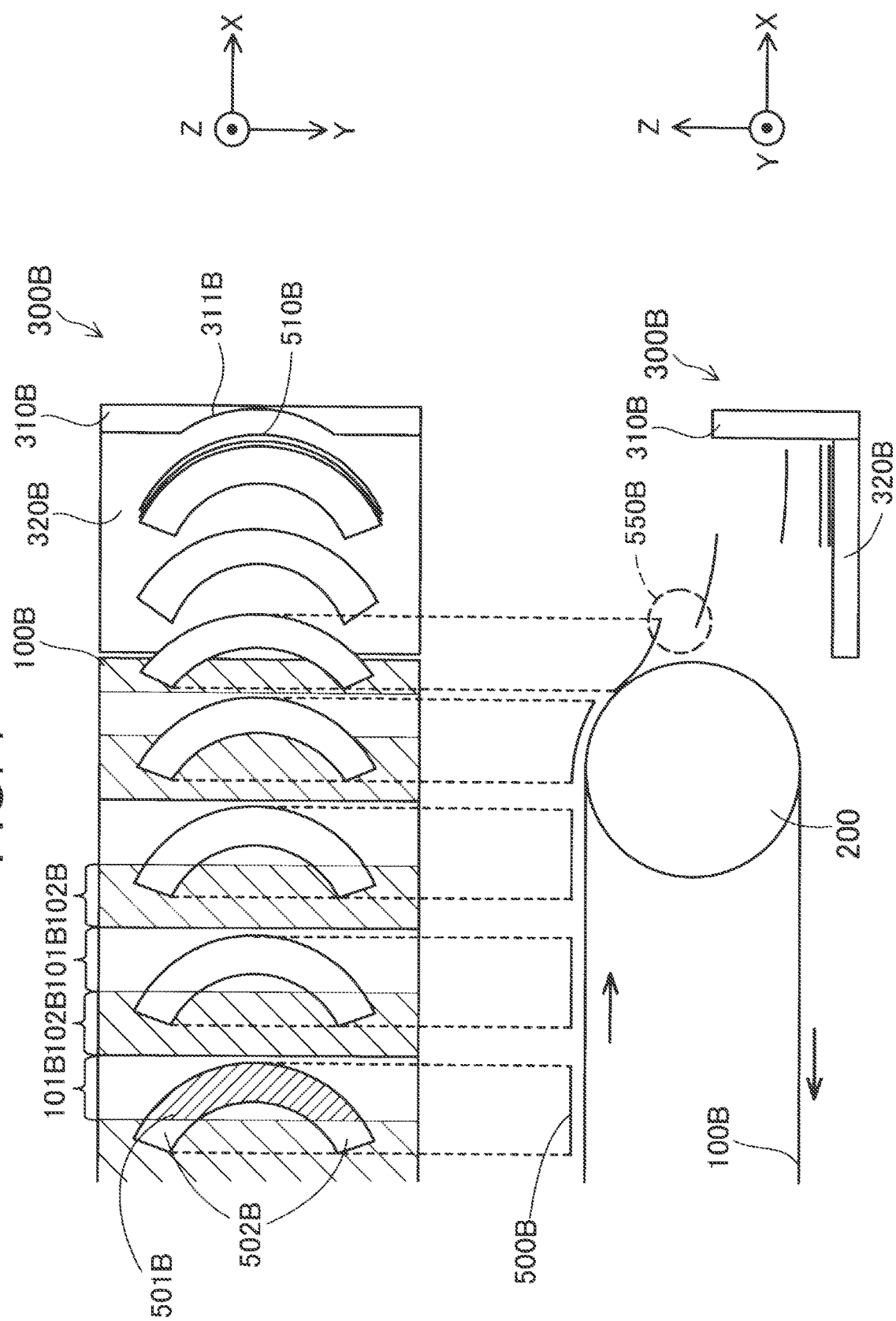

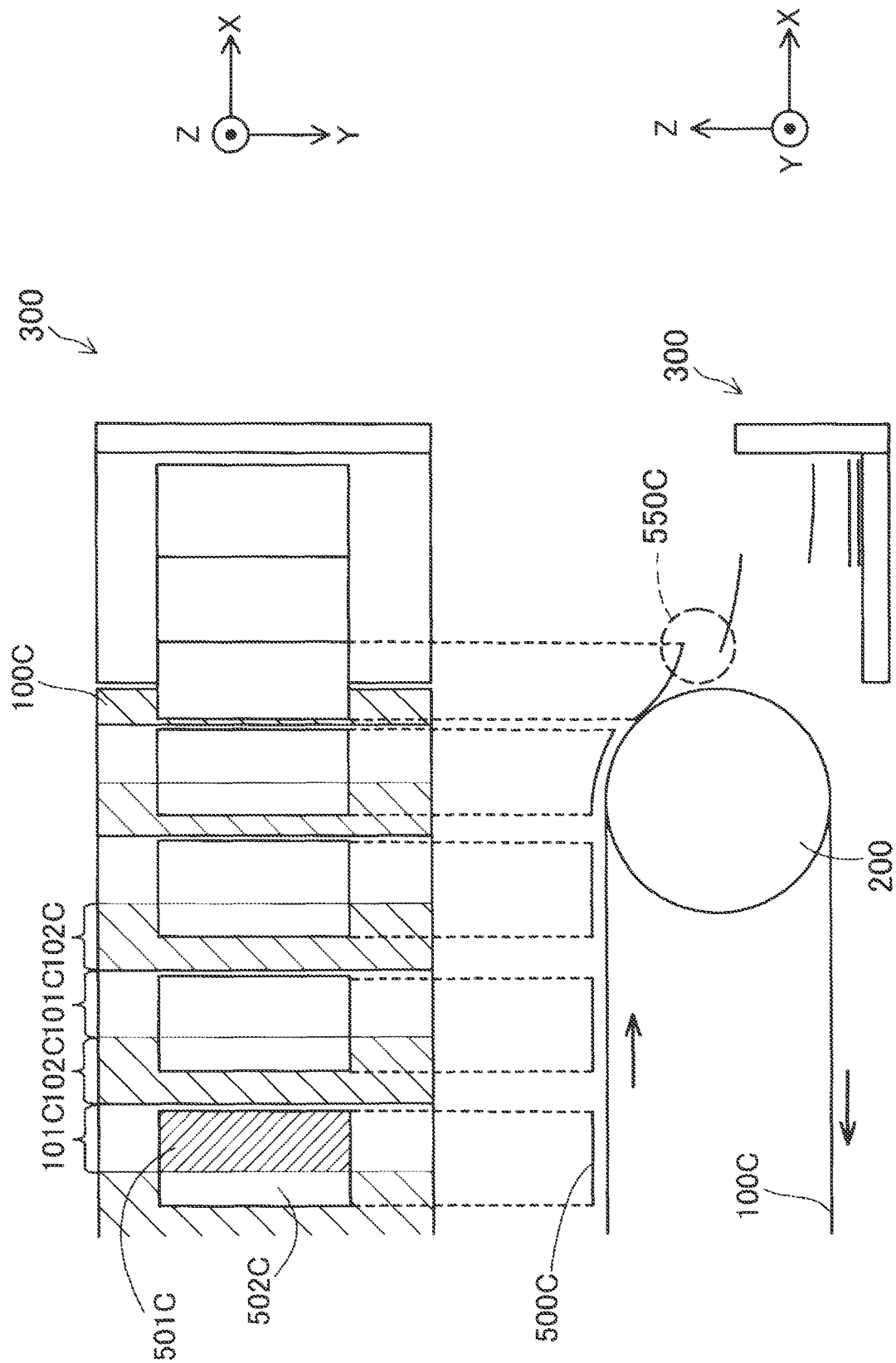

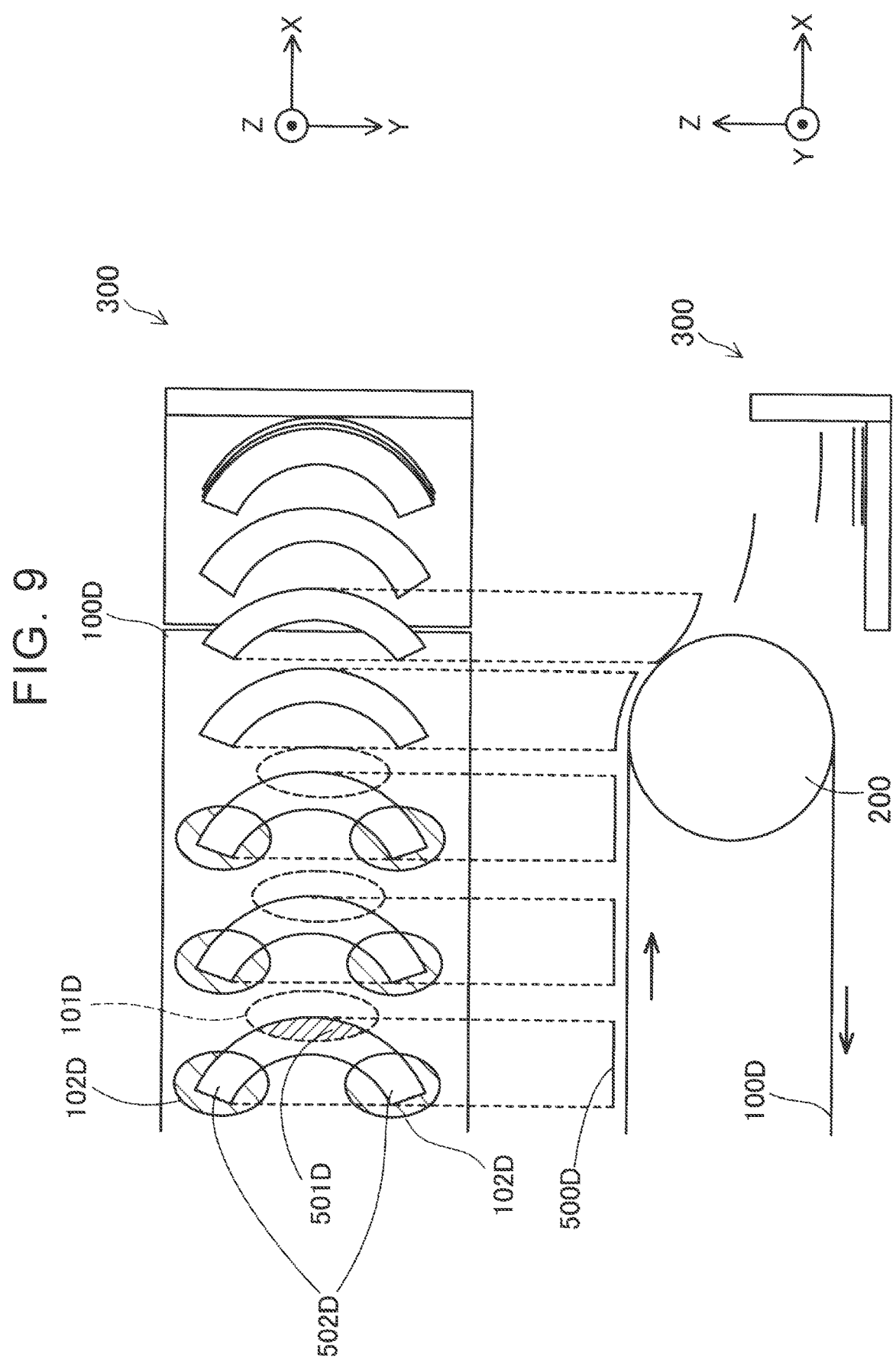

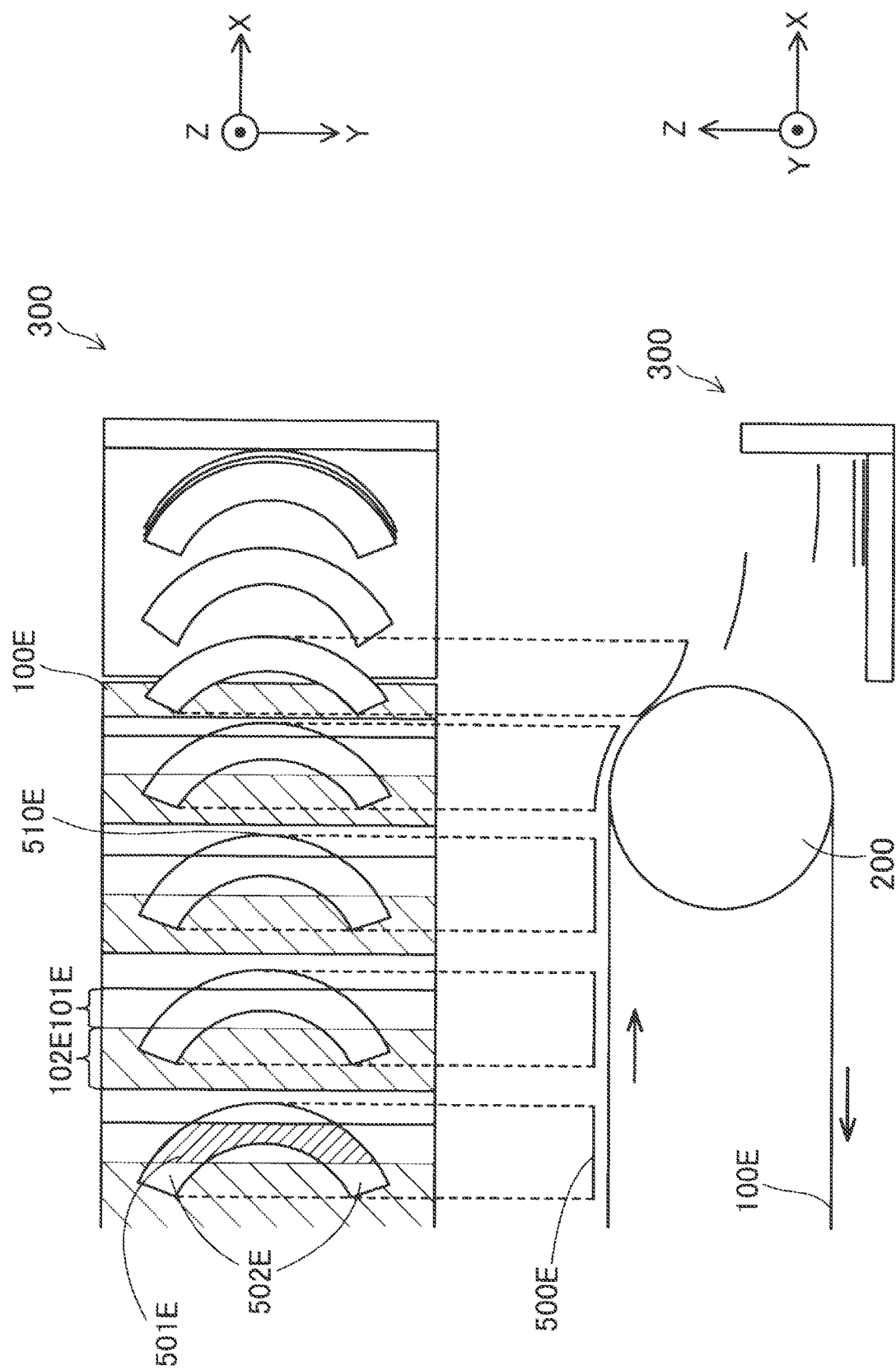

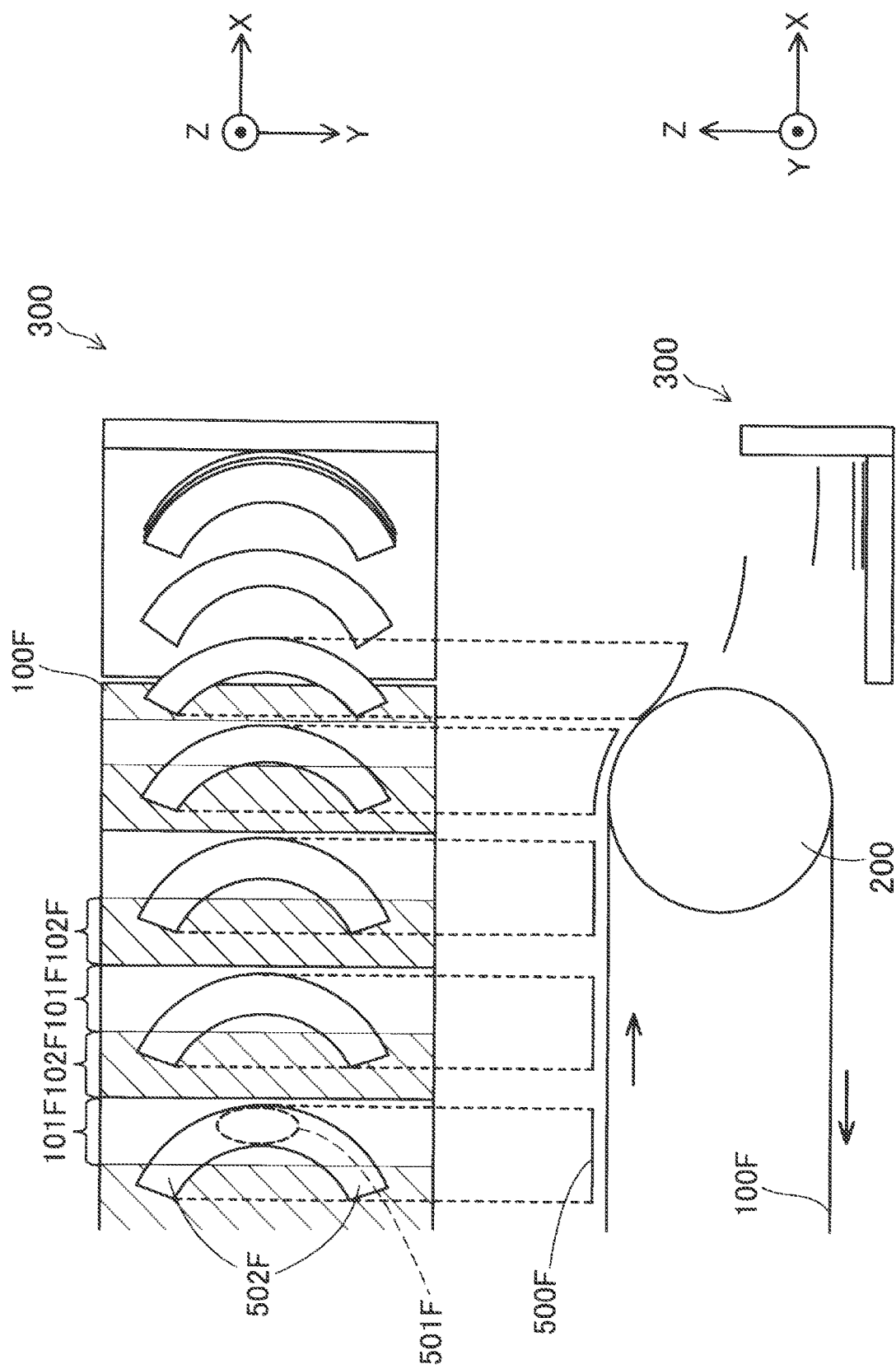

METHOD OF TRANSPORTING MEMBERS AND CONVEYING APPARATUS

CROSS-REFERENCE TO RELATED APPLICATION

This application claims priority to Japanese Patent Application No. 2020-116128 filed on Jul. 6, 2020, incorporated herein by reference in its entirety.

BACKGROUND

1. Technical Field

The disclosure relates to a method of transporting members, and a conveying apparatus.

2. Description of Related Art

As a method of transporting members formed of a magnetic material, a method of transporting the members by causing a multiplicity of electromagnets assembled with a conveyor belt to attract the magnetic material is known. In one example of this method, electric current supplied to given electromagnets is controlled, so that the force with which the magnetic material is attracted to the electromagnets is controlled. The current stops being supplied to the electromagnets, at a location above a certain collection unit, so that the force with which the magnetic material is attracted to the electromagnets is eliminated, and the magnetic members fall down to the collection unit. According to a method of transporting magnetic members, as presented in Japanese Unexamined Patent Application Publication No. 2005-179031 (JP 2005-179031 A), setting for driving a conveyor system is automatically performed, based on data concerning the length of each magnetic member, and the position at which the magnetic member is transferred from a device of the previous step, so as to set the timing of energization and de-energization of the electromagnets, thus making it possible to intermittently transport magnetic members of a wide variety of sizes.

SUMMARY

The inventors studied a method of transporting a plurality of magnetic bodies, using a belt conveyor including an endless belt that circulates and travels around two rotating rolls, in which the magnetic bodies attracted to the belt by electromagnets are released from the belt due to the inertia force, when the belt reaching one of the rolls is folded back along the roll. The magnetic body released from the belt abuts against a member against which the magnetic body can abut, and which was prepared in advance, ahead of the magnetic body in the traveling direction, and then falls downward. In this transportation method, if the rolls are rotated at a high speed, a front end of the magnetic body released from the belt that is traveling at the high speed may be brought into contact with a rear end of another magnetic body that was previously released from the belt. The magnetic bodies that contact with each other may become entangled, depending on the shape of the magnetic bodies.

This disclosure can be implemented in the following forms.

(1) According to one aspect of the disclosure, a method of transporting a plurality of sheet-like members each containing a magnetic material is provided. The method of transporting the sheet-like members includes a first step of placing one of the sheet-like members on an endless belt, and a second step of releasing the one of the sheet-like members placed in the first step, from a portion of the endless belt which is moved and folded back along a roller, and the first step and the second step are repeated. The endless belt includes a first magnetic force generating portion configured to generate a first magnetic force, and a second magnetic force generating portion configured to generate a second magnetic force that is stronger than the first magnetic force. In the first step, the one of the sheet-like members is placed on the endless belt, such that a first portion of the sheet-like member containing the magnetic material is located in the first magnetic force generating portion, and a second portion of the sheet-like member containing the magnetic material and located rearward of the first portion as viewed in a conveying direction of the sheet-like member is located in the second magnetic force generating portion. In this aspect, the force with which the second portion attracts the endless belt is larger than that of the first portion. Therefore, the position of the second portion on the roller, at which the second portion is released from the endless belt when it is moved and folded back along the roller, shifts in the moving direction of the endless belt, from the position on the roller at which the first portion is released from the endless belt. Thus, the sheet-like member released from the endless belt flies, with an attitude that deviates from an attitude parallel to the flying direction. As a result, a clearance appears in a direction perpendicular to the flying direction, between the second portion of the sheet-like member previously released from the belt, and the first portion of another sheet-like member subsequently released from the belt. With the clearance thus provided, the sheet-like member previously released from the belt can be made less likely or unlikely to contact with the sheet-like member subsequently released from the belt.

(2) In the method according to the above aspect, each of the sheet-like members may have a thickness that is equal to or smaller than 0.1 mm. In this case, the rigidity of the sheet-like member is reduced, as compared with the case where the thickness is larger than 0.1 mm. Thus, the attitude of the sheet-like member released from the endless belt can be effectively made different from the attitude parallel to the flying direction.

(3) In the method according to the above aspect, the first magnetic force generating portion may extend in a moving direction of the endless belt, and the second magnetic force generating portion may be disposed on opposite sides of the first magnetic force generating portion, and may extend in the moving direction of the endless belt. Each of the sheet-like members may be positioned, such that a leading end of a portion of the sheet-like member containing the magnetic material as viewed in the conveying direction is included in the first portion, and a trailing end of a portion of the sheet-like member containing the magnetic material as viewed in the conveying direction is included in the second portion. In this case, the position at which the trailing end is released from the belt shifts in the traveling direction of the belt, from the position at which the leading end is released from the belt. Thus, the sheet-like member released from the endless belt flies, with the attitude that deviates from the attitude parallel to the flying direction. As a result, a clearance appears in the direction perpendicular to the flying direction, between the trailing end of the sheet-like member previously released from the belt, and the leading end of the sheet-like member subsequently released from the belt. With the clearance thus provided, the sheet-like member previously released from the belt can be made less likely or unlikely to contact with the sheet-like member subsequently released from the belt.

(4) According to another aspect of the disclosure, a conveying apparatus that transports a plurality of sheet-like members each containing a magnetic material is provided. The conveying apparatus includes an endless belt on which the sheet-like members are placed, a roller around which the endless belt is looped, and which is configured to move and fold back the endless belt. The sheet-like members are successively released from the endless belt while the endless belt is moving along the roller. In the conveying apparatus, the endless belt includes a first magnetic force generating portion configured to generate a first magnetic force, and a second magnetic force generating portion configured to generate a second magnetic force that is stronger than the first magnetic force. A first portion of each of the sheet-like members which contains the magnetic material is located in the first magnetic force generating portion, and a second portion of each of the sheet-like members which contains the magnetic material and is located reward of the first portion as viewed in a conveying direction of the sheet-like members is located in the second magnetic force generating portion.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 7 is a view useful for describing a second embodiment;

FIG. 8 is a view useful for describing a third embodiment;

FIG. 9 is a view useful for describing a fourth embodiment;

FIG. 10 is a view useful for describing a fifth embodiment; and

FIG. 11 is a view useful for describing a sixth embodiment.

DETAILED DESCRIPTION OF EMBODIMENTS

Configuration of Conveying Apparatus 10

Figure 1:
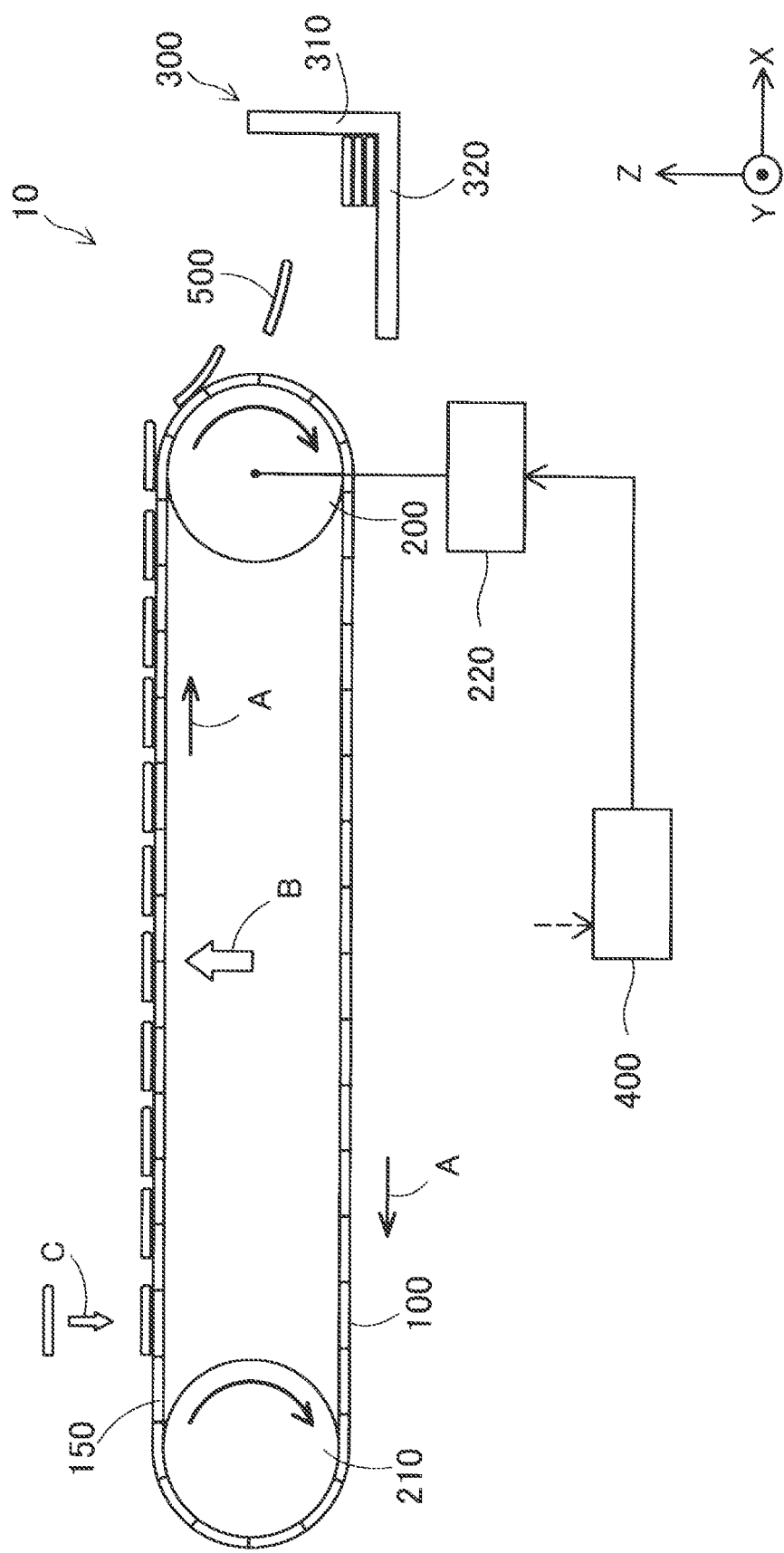
FIG. 1 is a view schematically showing the configuration of a conveying apparatus according to a first embodiment.

FIG. 1 schematically shows the configuration of a conveying apparatus 10 of a first embodiment. The conveying apparatus 10 includes an endless belt 100, first roller 200, second roller 210, roller drive source 220, holder 300, and controller 400. In FIG. 1, the X-axis represents the moving direction of the endless belt 100, and the conveying direction of workpieces 500 that will be described later, and the Z-axis represents the vertical direction. The negative direction on the Z-axis is the downward direction of the gravitational force. In FIG. 1, the thickness of each workpiece 500 is magnified, for the sake of better understanding.

A plurality of workpieces 500 is placed on the endless belt 100. The endless belt 100 is moved in directions of arrows A, along the first roller 200 and second roller 210, so as to transport the workpieces 500 to the holder 300. The endless belt 100 includes a plurality of magnets 150. With the magnets 150 thus provided, the endless belt 100 has magnetic force, and can retain the workpieces 500 against a surface of the endless belt 100. The magnetic force of the endless belt 100 will be described later.

Figure 2:
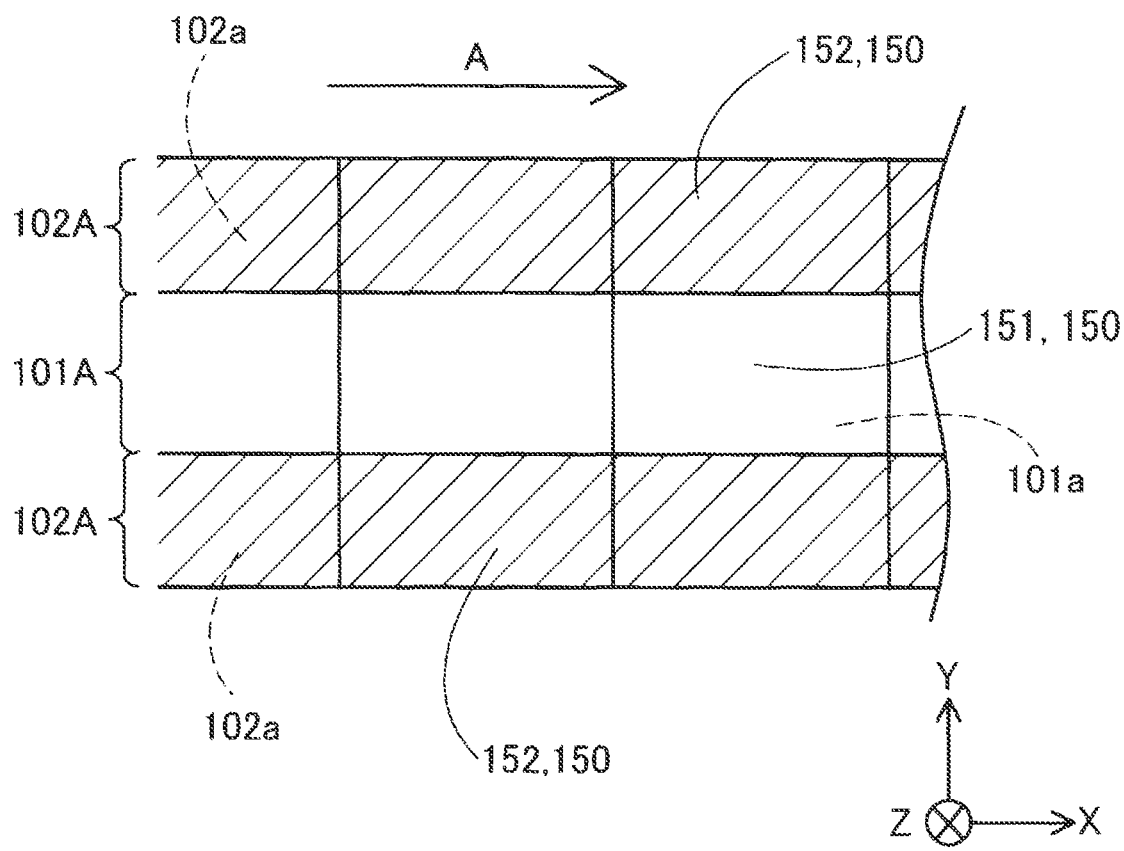
FIG. 2 is a view useful for describing the arrangement of magnets.

Referring to FIG. 2, the arrangement of the magnets 150 will be described. FIG. 2 shows a part of the conveying apparatus 10 when viewed in a direction of an outlined arrow B in FIG. 1. Each magnet 150 is disposed on the endless belt 100, so as to retain a corresponding one of the workpieces 500 on the endless belt 100. Electric current is supplied from a current supplier (not shown) to each magnet 150, via a corresponding current supply line (not shown), so as to energize and deenergize the magnet 150. The magnetic force thus generated by the magnets 150 when energized causes the workpieces 500 to stick to the endless belt 100.

As shown in FIG. 2, the magnets 150 are disposed on a surface of the endless belt 100 opposite to the surface on which the workpieces 500 are placed. In this embodiment, the magnets 150 are disposed on the surface of the endless belt 100 opposite to the surface on which the workpieces 500 are placed, such that the magnets 150 are in contact with the endless belt 100. The magnets 150 include a plurality of first-type magnets 151, and a plurality of second-type magnets 152.

The first-type magnets 151 are arranged in the moving direction of the endless belt 100. In FIG. 2, the first-type magnets 151 are connected by a chain (not shown) with no clearances provided therebetween, in the X-axis direction, such that the magnets 151 are movable in the moving direction of the endless belt 100. The second-type magnets 152 are disposed on the opposite sides of the first-type magnets 151, and are arranged in the moving direction of the endless belt 100. The second-type magnets 152, which are attached to a chain, are connected with no clearances provided therebetween in the X-axis direction, such that the magnets 152 are movable in the moving direction of the endless belt 100. Each of the chains attached to the first-type magnets 151 and the second-type magnets 152 are looped around the first roller 200 and the second roller 210.

With the magnets 150 thus positioned, the endless belt 100 can generate magnetic force for retaining the workpieces 500 against the surface of the endless belt 100. A portion of the endless belt 100 on which the first-type magnets 151 are disposed can generate first magnetic force by means of the first-type magnets 151 to which current is supplied. The portion of the endless belt 100 which can generate the first magnetic force will be called first magnetic force portion 101a. The first-type magnets 151 and the first magnetic force portion 101a will be collectively called first magnetic force generating portion 101A. Portions of the endless belt 100 on which the second-type magnets 152 are disposed have second magnetic force. Each of the portions of the endless belt 100 having the second magnetic force will be called second magnetic force portion 102a. The second-type magnets 152 and the second magnetic force portion 102a will be collectively called second magnetic force generating portion 102A (see hatched portions in FIG. 2). The magnetic force of the second-type magnet 152 is larger than that of the first-type magnet 151, and the second magnetic force is stronger than the first magnetic force. The magnetic force of the second magnetic force generating portion 102A is stronger than the magnetic force that can be generated by the first magnetic force generating portion 101A. The first magnetic force generating portion 101A extends in the moving direction of the endless belt 100, and the second magnetic force generating portions 102A are located on the opposite sides of the first magnetic force generating portion 101A, and extend in the moving direction of the endless belt 100.

The first roller 200 is connected to the roller drive source 220, and is thus able to rotate (see FIG. 1). In this embodiment, the first roller 200 rotates clockwise, and moves the endless belt 100 in the traveling direction while folding back the endless belt 100 along the first roller 200, thereby to release the workpieces 500 from the endless belt 100 in a repetitive manner. The second roller 210 is not connected to the roller drive source 220, and rotates in accordance with rotation of the first roller 200. With the first roller 200 and second roller 210 thus rotated, the chains connecting the magnets 150 and the endless belt 100 are moved in coordination with each other.

The roller drive source 220 supplies electric power for rotating the first roller 200, to the first roller 200. The roller drive source 220 supplies electric power to the first roller 200, in response to a command of the controller 400. In this connection, a drive source similar to the roller drive source 220 may also be connected to the second roller 210, and the second roller 210 may be rotated by the drive source.

The holder 300 receives the workpieces 500 that fly away from the endless belt 100 according to the method of transporting the workpieces 500 as described later, and holds the workpieces 500. The workpieces 500 are stacked on the holder 300. The holder 300 has a receiving portion 310 and a stacking portion 320. The receiving portion 310 is a portion that contacts with the workpieces 500 when they are released from the endless belt 100. The stacking portion 320 is a portion on which the workpieces 500 that have contacted with the receiving portion 310 fall down.

The controller 400 controls the process of transporting the workpieces 500 as will be described later. The controller 400 controls the speed of rotation of the first roller 200, by controlling electric power supplied from the roller drive source 220 to the first roller 200. In this embodiment, the speed of movement of the endless belt 100 caused by rotation of the first roller 200 is 200 m/min. The controller 400 controls current supplied to each magnet 150, by controlling the current supplier. The controller 400 generates a command to the current supplier, to make the current supplied to the second-type magnets 152 larger than the current supplied to the first-type magnets 151. In this embodiment, during the process of transporting the workpieces 500, electric current is supplied to all of the magnets 150.

Method of Transporting Workpieces 500

Figure 3:
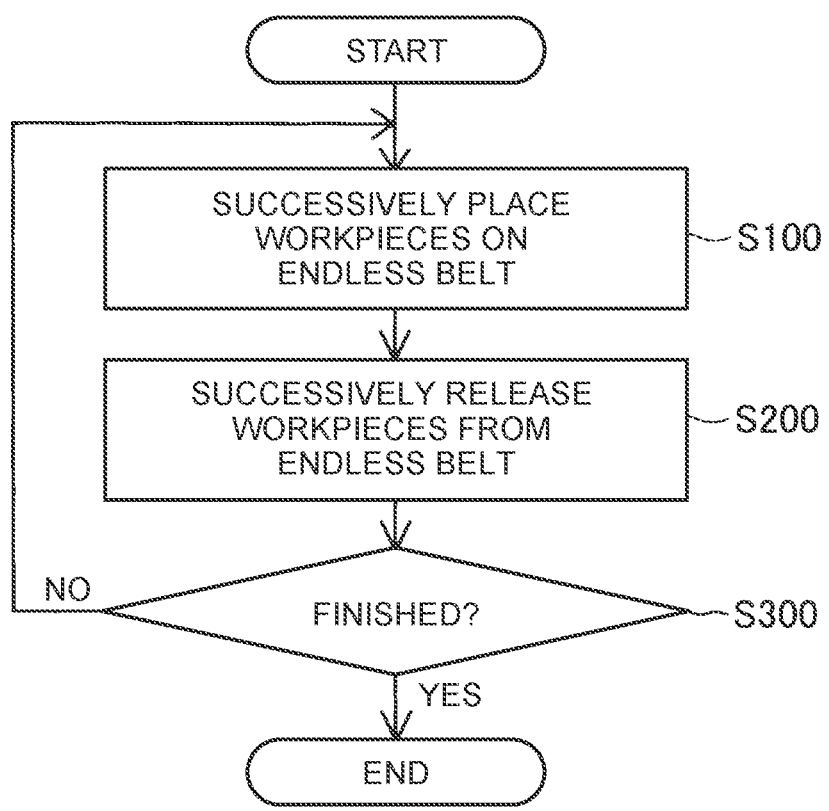
FIG. 3 is a flowchart illustrating one example of a method of transporting workpieces.

FIG. 3 is a flowchart illustrating one example of the method of transporting the workpieces 500. In step S100, the workpieces 500 are successively placed on the endless belt 100 that is moved by the first roller 200 and the second roller 210. In this embodiment, each of the workpieces 500 is a magnetic body formed of an alloy containing iron, and is a sheet-like member having a thickness of 0.1 mm.

Figure 4:
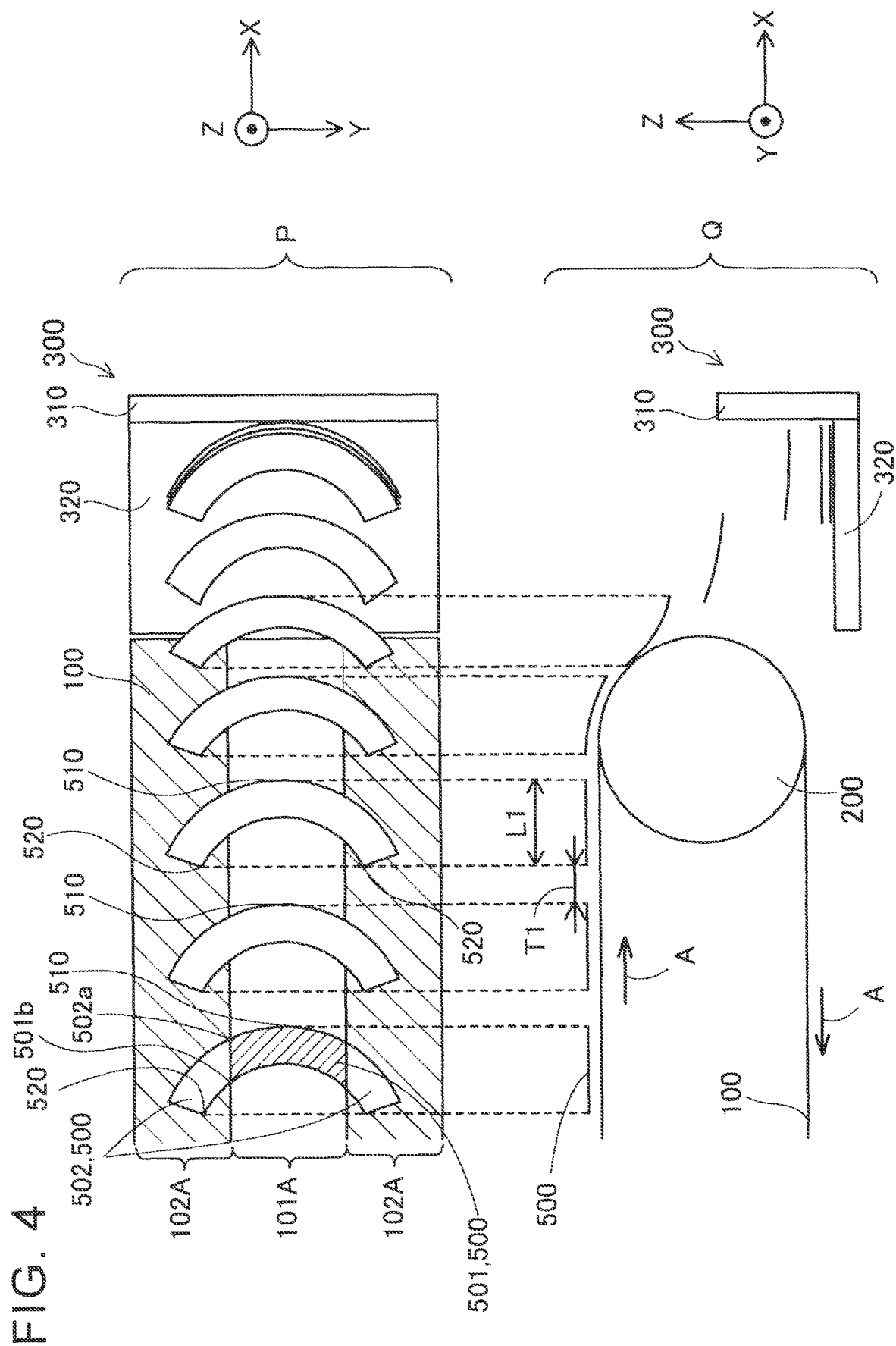
FIG. 4 is a view useful for describing transportation of workpieces using an endless belt.

Referring to FIG. 4, transportation of the workpieces 500 by means of the endless belt 100 will be described. In the lower section of FIG. 4, the workpieces 500 are illustrated as if they float above the endless belt 100, but, actually, the workpieces 500 stick to the endless belt 100, due to the magnetic force possessed by the endless belt 100. The upper section of FIG. 4, which is labelled "P", is a view of the conveying apparatus 10 as seen in the negative direction of the Z-axis. The lower section of FIG. 4, which is labelled "Q", is a view of the conveying apparatus 10 as seen in the negative direction of the Y-axis. In FIG. 4, the magnets are not illustrated.

As shown in FIG. 4, each of the workpieces 500 has a generally semicircular shape having a hollow central portion, when viewed in the direction of the Z-axis, in a condition where the workpieces 500 are placed on the endless belt 100. In this embodiment, each workpiece 500 that has been cut out by another device (not shown) is placed on the endless belt 100, as indicated by an outlined arrow "C" in FIG. 1.

The placement of the workpieces 500 on the endless belt 100 will be described in detail. Each of the workpieces 500 has a first portion 501 including a leading end as viewed in the conveying direction. The leading end of the workpiece will be called workpiece leading end 510. The workpiece 500 is placed on the endless belt 100, such that the first portion 501 is not located in the second magnetic force generating portions 102A, but is located in the first magnetic force generating portion 101A (see FIG. 4). In FIG. 4, the first portion 501 of one of the workpieces 500 is indicated by a hatched area. The other workpieces 500 are not subjected to hatching.

Each of the workpieces 500 has second portions 502 including trailing ends as viewed in the conveying direction. The trailing end of the workpiece will be called workpiece trailing end 520. In the conveying direction of the workpiece 500, the workpiece 500 is placed on the endless belt 100, such that the second portions 502 are not located in the first magnetic force generating portion 101A, but are located in the second magnetic force generating portions 102A. In FIG. 4, portions other than the hatched area in the above-indicated one workpiece 500 provide the second portions 502. When the front ends of the first portion 501 and second portions 502 in the conveying direction of the workpiece 500 are compared with each other, the workpiece leading end 510 as the front end of the first portion 501 is located ahead of front ends 502a of the second portions 502 in the conveying direction. Also, when the rear ends of the first portion 501 and second portions 502 in the conveying direction of the workpiece 500 are compared with each other, workpiece trailing ends 520 as the rear ends of the second portions 502 are located rearward of a rear end 501b of the first portion 501 in the conveying direction.

The workpieces 500 are respectively arranged, such that the distance T1 between the workpiece trailing end 520 of a certain workpiece 500 and the workpiece leading end MO of the following workpiece 500 that is transported next is larger than zero, and is equal to or smaller than a dimension L1 of the workpiece 500 as measured in the conveying direction.

In step S200, the endless belt 100 is caused to travel in the direction of arrows A, so that the workpieces 500 are successively released from the endless belt 100 (see a right portion in the lower section of FIG. 4). The workpiece 500 carried in the moving direction of the endless belt 100 is released from the endless belt 100, when the corresponding portion of the endless belt 100 is folded back clockwise along the first roller 200.

In step S300, the controller 400 determines whether a command to finish the process of transporting the workpieces 500 has been generated. When the command to finish the process of transporting the workpieces 500 has been generated, the process is finished. When the command to finish the process of transporting the workpieces 500 has not been generated, the control returns to step S100. Namely, steps S100, S200 are repeated, until the command to finish the process of transporting the workpieces 500 is generated. In this connection, a plurality of workpieces 500 is placed on the endless belt 100. Therefore, in the conveying apparatus 10, steps S100, S200 are executed in parallel, while overlapping with each other, with respect to the respective workpieces 500.

Figure 5:
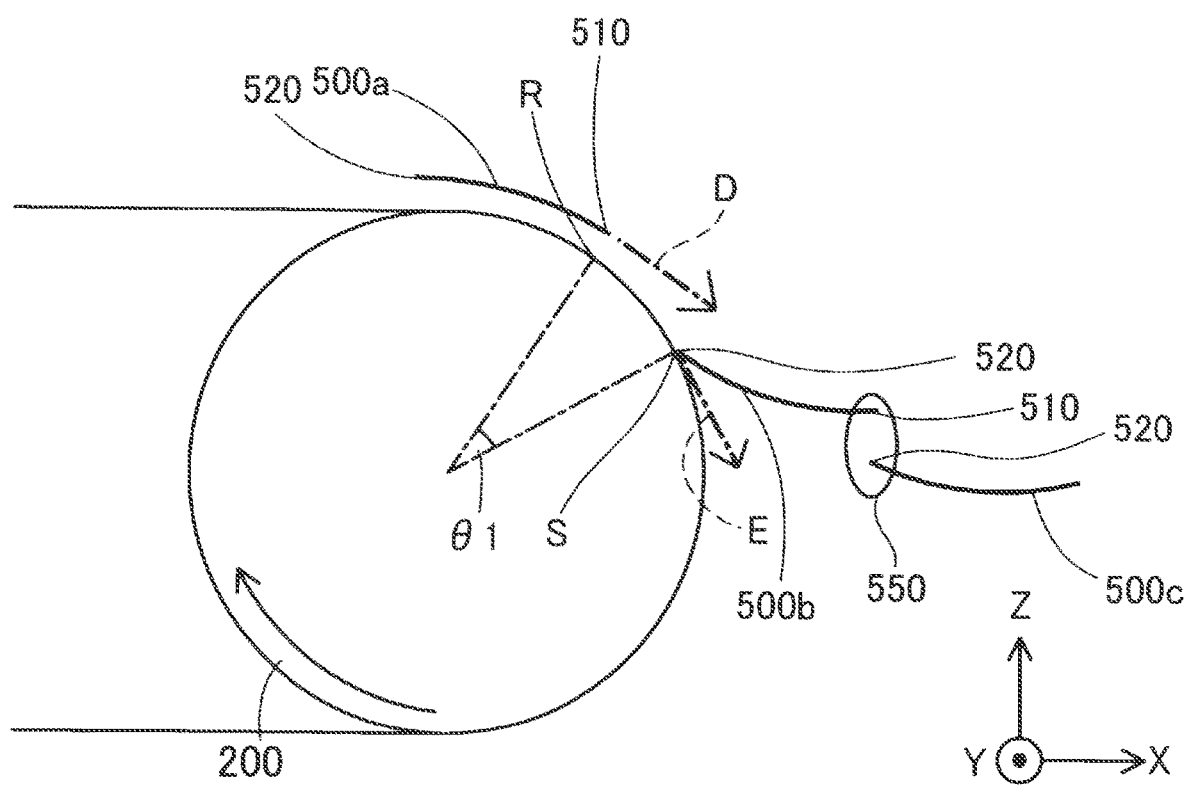
FIG. 5 is a view useful for describing release of workpieces in detail.

Referring to FIG. 5, release of the workpieces 500 will be described in detail. The manner of releasing the workpiece leading end MO from the endless belt 100 will be described, using a workpiece 500a as one of the workpieces 500. The manner of releasing the workpiece trailing ends 520 from the endless belt 100 will be described, using a workpiece 500b as one of the workpieces 500. The workpiece 500b corresponds to a condition where it has been carried by the first roller 200 and turned by an angle of θ1 from the position of the workpiece 500a. As in FIG. 4, the workpiece 500a is illustrated as if it floats above the endless belt 100, for the sake of better understanding.

At the moment when the workpiece leading end 510 is released from the endless belt 100, at a point R in FIG. 5, the workpiece leading end 510 moves in a direction of a tangent to the first roller 200. When the force that retains the workpiece leading end 510 against the first roller 200 becomes equal to zero, the workpiece leading end 510 moves forward in a direction of arrow D as the direction of the tangent to the first roller 200. As described above, the magnetic force of the second magnetic force generating portions 102A is stronger than the magnetic force that can be generated by the first magnetic force generating portion 101A. Therefore, at the point R, the workpiece trailing ends 520 are carried in the moving direction of the endless belt 100, while being retained against the endless belt 100.

While the above description focuses on the workpiece leading end 510 and the workpiece trailing ends 520, the other portion of the first portion 501 than the workpiece leading end 510 and the other portions of the second portions 502 than the workpiece trailing ends 520 are released from the endless belt 100 in the same manner as the workpiece leading end 510 and the workpiece trailing ends 520. Namely, at the point R, the first portion 501 located on the first magnetic force generating portion 101A is released from the endless belt 100, but the second portions 502 are not released from the endless belt 100. Thus, from the point R to a point on the endless belt 100 where the second portions 502 are released from the endless belt 100, the workpiece 500 is carried in a condition where the first portion 501 is separated from the endless belt 100, and the second portions 502 stick to the endless belt 100.

Then, at a point S in FIG. 5, the second portions 502 including the workpiece trailing ends 520 are released from the endless belt 100 in a direction of arrow E in FIG. 5. The position on the first roller 200 at which the second portions 502 are released from the endless belt 100 that is moved while being folded back along the first roller 200 shifts by an angle of θ1 in the direction of movement of the endless belt 100, from the position on the first roller 200 at which the first portion 501 is released from the endless belt 100. As a result, as typically indicated by the workpiece 500b, when the workpiece 500 is fully released from the endless belt 100, it flies with an attitude that varies from an attitude parallel to the direction of arrow D in which the workpiece 500 would fly if the whole workpiece 500 is released from the endless belt 100 at the same location, i.e., at the point R.

Figure 6:
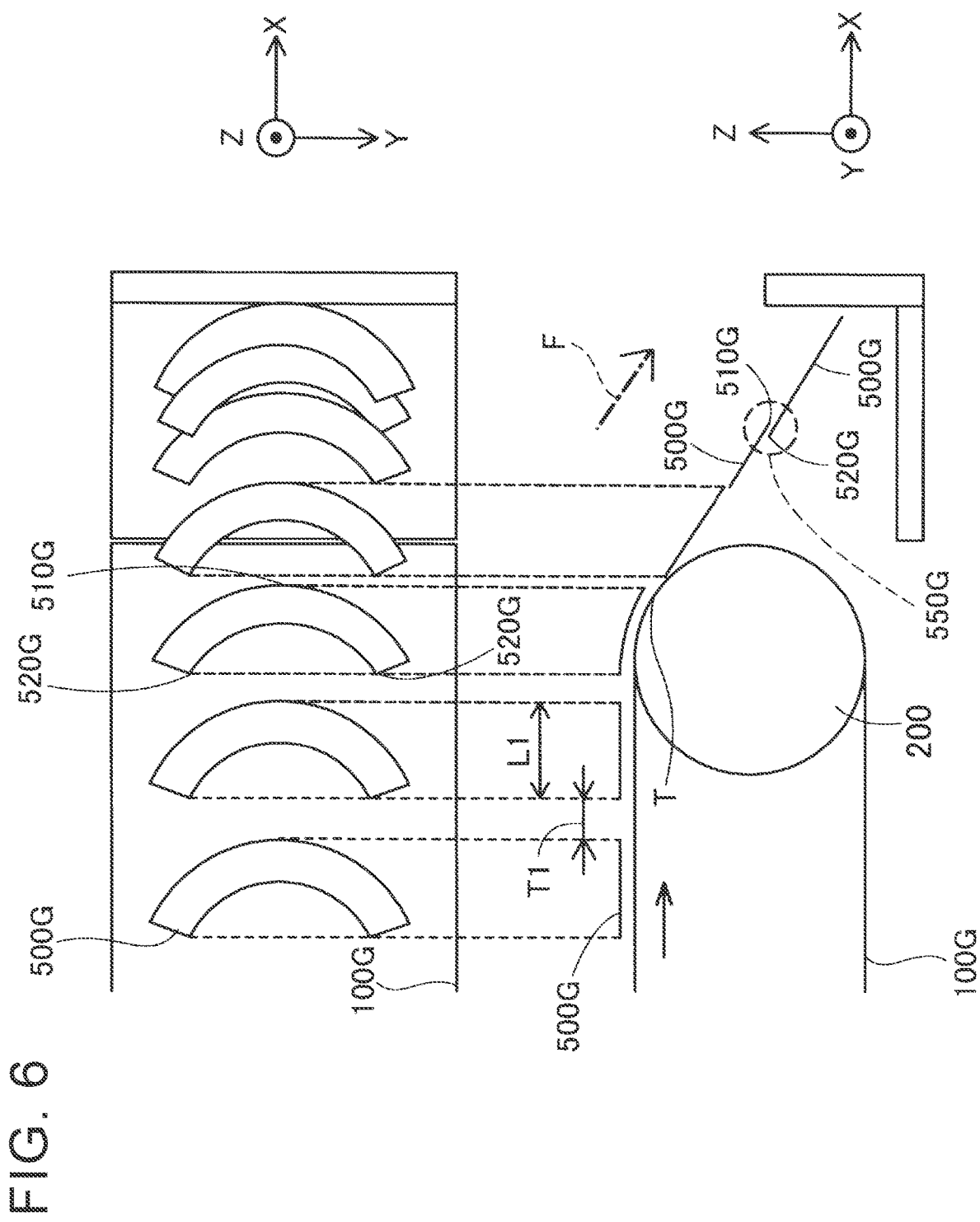
FIG. 6 is a view useful for describing a method of transporting workpieces in a comparative example.

Referring to FIG. 6, the manner of transporting workpieces 500G will be described as a comparative example. FIG. 6 corresponds to FIG. 4. In FIG. 6, magnets are not illustrated. The comparative example is different from this embodiment in that all of the magnets generate the same magnetic force. More specifically, the magnetic force generated by all of the magnets 150G is the same as the magnetic force of the first-type magnets 151. The other configuration is identical with that of this embodiment. In the comparative example, the endless belt 100G has the first magnetic force at any location.

Since the endless belt 100G has the same magnetic force at any location in the comparative example, all portions of the workpiece 500G can be assumed to be released from the endless belt 100G at point T in FIG. 6. As a result, as shown in FIG. 6, the workpiece 500G flies with an attitude that is substantially in parallel with a direction of arrow F as the flying direction. The speed at which the flying workpiece 500G flies is slower than the speed at which the workpiece 500G is transported, due to the air resistance. Therefore, almost no clearance (see 550G in FIG. 6) as measured in a direction perpendicular to the flying direction appears between the workpiece trailing ends 520G of the workpiece 500G that is previously released from the endless belt 100, and the workpiece leading end 510G of the following workpiece 500G that is subsequently released from the endless belt 100. Thus, the workpiece 500G may be brought into contact with each other in the air, and become entangled and superposed on each other (see a right portion in the upper section of FIG. 6).

On the other hand, in this embodiment, the workpiece 500 flies, with the attitude that deviates from the attitude parallel to the flying direction (see FIG. 5), as described above. As a result, a clearance 550 appears in a direction perpendicular to the flying direction, between the workpiece trailing ends 520 of the workpiece 500c that is previously released from the endless belt 100, and the workpiece leading end 510 of another workpiece 500b that is subsequently released from the endless belt 100. With the clearance 550 thus provided, the workpiece 500c that is previously released from the endless belt 100 is less likely or unlikely to contact with the workpiece 500b that is subsequently released from the endless belt 100.

As described above, the thickness of the workpiece 500 of this embodiment is 0.1 mm. When the thickness of the workpiece 500 is 0.1 mm, the rigidity of the workpiece 500 is lower than that in the case where the thickness is larger than 0.1 mm. Thus, the attitude of the workpiece 500 released from the endless belt 100 can be effectively changed from the attitude parallel to the flying direction.

When adjacent ones of the workpieces 500 are sufficiently spaced apart from each other, in other words, when the distance between adjacent ones of the workpieces 500 is sufficiently large, the workpiece 500 previously released from the endless belt 100 may be placed on the holder 300 before the following workpiece 500 leaves the endless belt 100. However, if the distance between adjacent ones of a large number of workpieces 500 is increased to such an extent that the adjacent workpieces 500 do not contact with each other in the air, it would take a long time to transport the workpieces 500. Thus, it is preferable that the distance between the workpieces 500 is small. In this embodiment that adopts the configuration as described above, the distance T1 between the workpiece trailing end 520 of one workpiece 500 and the workpiece leading end 510 of another workpiece 500 following the one workpiece 500 can be set to be equal to or smaller than the dimension L1 of the workpiece 500 as measured in the conveying direction.

Second Embodiment

Referring to FIG. 7, a second embodiment will be described. FIG. 7 corresponds to FIG. 4. FIG. 8 through FIG.

11, which will be described later, also correspond to FIG. 4. In the first embodiment, the first magnetic force generating portion 101A extends in the moving direction of the endless belt 100, and the second magnetic force generating portions 102A are disposed on the opposite sides of the first magnetic force generating portion 101A, and extend in the moving direction of the endless belt 100. The second embodiment is different from the first embodiment in that first magnetic force generating portions 101B and second magnetic force generating portions 102B are alternately arranged in the moving direction of an endless belt 100B, and each of the magnetic force generating portions 101B, 102B extends in a direction perpendicular to the moving direction. The second embodiment is also different from the first embodiment, in terms of the ranges of first portion 501B and second portion 502B of each workpiece 500B, and a holder 300B.

In FIG. 7, the second magnetic force generating portions 102B are represented by hatched portions of the endless belt 100B. The first magnetic force generating portions 101B are represented by the other portions of the endless belt 100B. The strength of the magnetic force of the first magnetic force generating portion 101B and that of the second magnetic force generating portion 102B are respectively equal to that of the magnetic force of the first magnetic force generating portion 101A and that of the second magnetic force generating portion 102A in the first embodiment.

The workpieces 500B are placed on the endless belt 100B, such that the first portions 501B are located in the first magnetic force generating portions 101B. The workpieces 500B are placed on the endless belt 100B, such that the second portions 502B are located in the second magnetic force generating portions 102B. In FIG. 7, a hatched portion of one of the workpieces 500B represents the first portion 501B. The other portions of the workpiece 500B than the hatched portion are the second portions 502B. In FIG. 7, hatching is not provided on the rest of the workpieces 500B. This similarly applies to FIG. 8 through FIG. 11 which will be described later.

In the second embodiment, the positions of the second portions 502B on the first roller 200 when the second portions 502B are released from the endless belt 100B that is moved while being folded back along the first roller 200 shift in the moving direction of the endless belt 100B, from the position of the first portion 501B on the first roller 200 when the first portion 501B is released from the endless belt 100B, as in the above embodiment. As a result, the workpiece 500B released from the endless belt 100B flies, with an attitude that deviates from the attitude parallel to the flying direction in which the workpiece 500B would fly in the case where the whole workpiece 500B is released from the endless belt 100B at the same location. Thus, a clearance 550B appears in a direction perpendicular to the flying direction, between the second portions 502B of the workpiece 500B that is previously released from the endless belt 100B, and the first portion 501B of another workpiece 500B that is subsequently released from the endless belt 100B. With the clearance thus provided, the workpiece 500B previously released from the endless belt 100B is less likely or unlikely to contact with the following workpiece 500B subsequently released from the endless belt 100B.

The receiving portion 310B of the second embodiment has a positioning portion 311B that receives a peripheral portion of the workpiece leading end 510B. The positioning portion 311B is recessed in the positive direction of the X-axis. The positioning portion 311B is shaped such that a part of an arc of the workpiece 500B, including the workpiece leading end 510B, can fit in the positioning portion 311B. The workpiece 500B that has been released from the endless belt 100B is brought into contact with the positioning portion 311B, and then falls down to the stacking portion 320B, without being displaced in the Y-axis direction. Thus, the holder 300B is able to more efficiently hold the workpieces, as compared with a holder having no positioning portion 311B. To efficiently hold workpieces released from the endless belt, the holder may be provided with a magnet or magnets attached to the inside or surface thereof In FIG. 4, FIG. 7, and FIG. 8 through FIG. 11 which will be described later, all of the workpieces are released from the endless belt with the same attitude in the same direction. However, the direction of release and the attitude after release are not accurately illustrated in these figures, but may vary depending on the magnitude of magnetic force and the size and shape of the workpieces.

Third Embodiment

Referring to FIG. 8, a third embodiment will be described. In the first embodiment, the workpiece 500 has a generally semicircular shape, which has a hollow central portion. The third embodiment is different from the first embodiment in that each workpiece 500C has a rectangular shape, as viewed in the negative direction of the Z-axis. In this case, the workpiece 500C is placed on the endless belt 100, such that a first portion 501C of the workpiece 500C is located in a first magnetic force generating portion 101C, and a second portion 502C is located in a second magnetic force generating portion 102C.

In this embodiment, too, the position of the second portion 502C on the first roller 200 when the second portion 502C is released from the endless belt 100C that is moved while being folded back along the first roller 200 shifts in the moving direction of the endless belt 100C, from the position of the first portion 501C on the first roller 200 when the first portion 501C is released from the endless belt 100C, as in the above embodiment. As a result, the workpiece 500C released from the endless belt 100C flies, with an attitude that deviates from the attitude parallel to the flying direction. Thus, a clearance 550C appears in a direction perpendicular to the flying direction, between the second portion 502C of the workpiece 500C that is previously released from the endless belt 100C, and the first portion 501C of another workpiece 500C that is subsequently released from the endless belt 100C. With the clearance thus provided, the workpiece 500C previously released from the endless belt 100C is less likely or unlikely to contact with the workpiece 500C subsequently released from the endless belt 100C.

For example, the workpiece may have a triangular shape, or a square shape, as viewed in the direction of the Z-axis. Also, while each workpiece is a magnetic body formed of an alloy containing iron, each workpiece is only required to contain a magnetic material, and a first portion of the portion containing the magnetic material may be located in the first magnetic force generating portion, while a second portion of the portion containing the magnetic material, which is located behind the first portion in the conveying direction of workpieces, may be located in the second magnetic force generating portion.

Fourth Embodiment

Referring to FIG. 9, a fourth embodiment will be described. The fourth embodiment is different from the above embodiments with respect to first magnetic force generating portions 101D, second magnetic force generating portions 102D, first portions 501D, and second portions 502D. In FIG. 9, the first magnetic force generating portions 101D are represented by elliptic portions defined by broken lines, and the second magnetic force generating portions 102D are represented by elliptic portions defined by solid lines. A part of each of the second magnetic force generating portions 102D is subjected to hatching. In the first embodiment, the first magnetic force generating portion 101A is located to extend in the moving direction of the endless belt 100, and the second magnetic force generating portions 102A are disposed on the opposite sides of the first magnetic force generating portion 101A, and extend in the moving direction of the endless belt 100. In the fourth embodiment, the first magnetic force generating portions 101D are located in a middle portion of the endless belt 100D as viewed in the width direction, and are arranged at equal intervals in the moving direction of the endless belt 100D. Also, the second magnetic force generating portions 102D are located in opposite end portions of the endless belt 100D as viewed in the width direction, and are arranged at equal intervals in the moving direction of the endless belt 100D. The interval at which the first magnetic force generating portions 101D are arranged is equal to the interval at which the second magnetic force generating portions 102D are arranged. The first magnetic force generating portions 101D and second magnetic force generating portions 102D are arranged in the conveying direction, such that the ranges of the first magnetic force generating portions 101D as measured in the conveying direction do not overlap the ranges of the second magnetic force generating portions 102D. Magnets are placed in first magnetic force portions corresponding to the first magnetic force generating portions 101D, and second magnetic force portions corresponding to the second magnetic force generating portions 102D. In FIG. 9, the first magnetic force generating portions 101D and second magnetic force generating portions 102D are partially omitted.

A hatched area in FIG. 9 indicates the first portion 501D of one workpiece 500D. Portions of the workpiece 500D surrounded by solid lines in FIG. 9 are the second portions 502D. The workpiece 500D is placed on the endless belt 100D, such that the first portion 501D of the workpiece 500D is located in the first magnetic force generating portion 101D, and the second portion 502D is located in the second magnetic force generating portion 102D. In this embodiment, portions of the workpiece 500D corresponding to the first portion 501D and the second portions 502D contain the magnetic material, and a portion of the workpiece 500D other than these portions contains no magnetic material. In FIG. 9, the first portions 501D and the second portions 502D are partially omitted.

The fourth embodiment yields the same effect as that of the above embodiments. Further, in the fourth embodiment, the number of magnets can be reduced to be smaller than those of the above embodiments. As a result, the cost for manufacturing the conveying apparatus can be reduced.

Fifth Embodiment

Referring to FIG. 10, a fifth embodiment will be described. In the first embodiment, the workpiece leading end 510 is included in the first portion 501, and the workpiece trailing ends 520 are included in the second portions 502. The fifth embodiment is different from the first embodiment in that a workpiece leading end 510E is not included in a first portion 501E, and the range of a first magnetic force generating portion 101E is smaller than that of the second embodiment. In FIG. 10, a hatched portion of the workpiece 500E represents the first portion 501E, and portions of the workpiece 500E located on one side of the hatched portion facing the negative direction of the X-axis are the second portions 502E.

The first portion 501E is located in a first magnetic force generating portion 101E of an endless belt 100E. The second portions 502E are located in a second magnetic force generating portion 102E of the endless belt 100E. While the workpiece 500 is a magnetic body in the above embodiments, portions of the workpiece 500E corresponding to the first portion 501E and second portions 502E contain a magnetic material, and the other portion contains no magnetic material in the fifth embodiment.

In this embodiment, too, the position of the second portions 502E on the first roller 200 when the second portions 502E are released from the endless belt 100E that is moved while being folded back along the first roller 200 shifts in the moving direction of the endless belt 100E, from the position of the first portion 501E on the first roller 200 when the first portion 501E is released from the endless belt 100E. Thus, substantially the same effect as those of the above embodiments is obtained.

Sixth Embodiment

Referring to FIG. 11, a sixth embodiment will be described. The sixth embodiment is different from the above embodiments with respect to a first portion 501F. This embodiment is identical with the second embodiment in terms of the arrangement of second magnetic force generating portions 102F, the magnitudes of magnetic forces of first magnetic force generating portions 101F and second magnetic force generating portions 102F, and second portions 502F. A portion of each workpiece 500F which is surrounded by a broken line in FIG. 11 corresponds to the first portion 501F. Portions of the workpiece 500F other than the first portion 501F, which are located in the first magnetic force generating portion 101F, contain no magnetic material. Portions of the workpiece 500F located in the second magnetic force generating portion 102F are the second portions 502F.

In this embodiment, too, the position of the second portions 502F on the first roller 200 when the second portions 502F are released from the endless belt 100F that is moved while being folded back along the first roller 200 shifts in the moving direction of the endless belt 100F, from the position of the first portion 501F on the first roller 200 when the first portion 501F is released from the endless belt 100F. Thus, the same effect as that of the above embodiments is obtained. As in the fourth embodiment through the sixth embodiment, the workpiece may have a portion or portions containing no magnetic material. In FIG. 11, the first portion 501F is not illustrated in some workpieces 500F.

Modified Examples

In the first embodiment, the speed at which the endless belt 100 travels is 200 m/min. It is to be understood, however, that the speed at which the endless belt is moved is not limited to 200 m/min. of the above embodiment, but may be set to any appropriate value depending on the type, shape, etc. of workpieces. In the case of the workpieces used in the embodiments, it is preferable, in terms of stacking of workpieces released from the endless belt, that the traveling speed of the endless belt is in the range of 100 to 500 m/min.

In the first embodiment, the workpieces 500 are arranged such that the distance T1 between the workpiece trailing end of one workpiece 500 and the workpiece leading end of another workpiece 500 that is transported next is larger than zero, and is equal to or smaller than the dimension L1 of each workpiece 500 as measured in the conveying direction. It is to be understood, however, that the workpieces may be arranged such that they are spaced from each other with a distance that is larger than the dimension of each workpiece as measured in the conveying direction.

In the first embodiment, the workpiece 500 is a magnetic body formed of an alloy containing iron, and has a thickness of 0.1 mm. While the thickness of the workpiece is preferably equal to or smaller than 0.1 mm, it may be larger than 0.1 mm. The workpiece may contain a metal, such as nickel or cobalt, other than iron.

In the first embodiment, the magnets 150 are disposed on the surface of the endless belt 100 opposite to the surface on which the workpieces 500 are placed, and are attached to the chain (not shown). However, the magnets may be bonded to the surface of the endless belt opposite to the surface on which the workpieces are placed, and may be transported as a unit with the endless belt. Also, the endless belt may consist of magnets. The endless belt is only required to include the first magnetic force generating portions capable of generating the first magnetic force, and the second magnetic force generating portions capable of generating the second magnetic force that is stronger than the first magnetic force.

Marks may be provided on portions of the endless belt corresponding to the first magnetic force generating portions and the second magnetic force generating portions, respectively. For example, red marks may be provided on portions of the endless belt corresponding to the first magnetic force generating portions, and blue marks may be provided on portions corresponding to the second magnetic force generating portions. With the marks thus provided, the workpieces can be easily positioned when they are placed on the endless belt. Similarly, marks may be provided on portions of each workpiece corresponding to the first portion and the second portion, respectively.

In the first embodiment, the first magnetic force generating portion 101A is able to generate the first magnetic force. However, the first magnetic force generating portion 101A may not generate magnetic force, namely, the first magnetic force may be equal to zero, and the second magnetic force generating portion may have the second magnetic force that is larger than zero.

In the first embodiment, the magnets 150 are disposed on the surface of the endless belt 100 opposite to the surface on which the workpieces 500 are placed, such that the magnets 150 contact with the endless belt. However, the magnets may be disposed with clearances provided between the magnets and the endless belt. Each magnet is only required to be positioned relative to the endless belt, such that the first magnetic generating portions of the endless belt can generate the first magnetic force, and the second magnetic force generating portions can generate the second magnetic force. When the first magnetic force is set to zero, no magnet may be provided at the locations of the endless belt corresponding to the first magnetic force generating portions.

In the first embodiment, electric current is supplied to all of the magnets 150 during the process of transporting the workpieces 500. However, the current supplied to the magnets may be stopped, over a range from point S in FIG. 5, for example, to the position at which a workpiece is placed on the endless belt again. In this manner, current consumption can be reduced.

In the first embodiment, the endless belt 100 has the first magnetic force generating portion 101A and the second magnetic force generating portions 102A. However, the endless belt may include a third magnetic force generating portion that has third magnetic force generated by third-type magnets, for example, other than the first magnetic force generating portion and second magnetic force generating portions. The second magnetic force is larger than the first magnetic force, and the third magnetic force is larger than the second magnetic force. A third portion of each workpiece, which is located rearward of the second portion, may be located in the third magnetic force generating portion.

This disclosure is not limited to the illustrated embodiments, but may be implemented with various configurations, without departing from its principle. For example, technical features of the embodiments corresponding to technical features in respective forms described in the "SUMMARY" may be replaced or combined as appropriate, so as to solve a part or the whole of the above problem, or achieve a part or the whole of the above effect. Also, any of the technical features may be eliminated as needed, if it is not described as being essential in this specification.

What is claimed is:

1. A method of transporting a plurality of sheet-like members each containing a magnetic material, comprising:
   a first step of placing one of the sheet-like members on an endless belt; and
   a second step of releasing the one of the sheet-like members placed in the first step, from a portion of the endless belt which is moved and folded back along a roller,
   wherein the first step and the second step are repeated,
   wherein the endless belt includes a first magnetic force generating portion configured to generate a first magnetic force, and a second magnetic force generating portion configured to generate a second magnetic force that is stronger than the first magnetic force, and
   wherein, in the first step, the one of the sheet-like members is placed on the endless belt, such that a first portion of the sheet-like member containing the magnetic material is located in the first magnetic force generating portion, and a second portion of the sheet-like member containing the magnetic material and located rearward of the first portion as viewed in a conveying direction of the sheet-like member is located in the second magnetic force generating portion.

2. The method according to claim 1, wherein each of the sheet-like members has a thickness that is equal to or smaller than 0.1 mm.

3. The method according to claim 1, wherein:
   the first magnetic force generating portion extends in a moving direction of the endless belt;
   the second magnetic force generating portion is disposed on opposite sides of the first magnetic force generating portion, and extends in the moving direction of the endless belt; and
   each of the sheet-like members is positioned, such that a leading end of a portion of the sheet-like member containing the magnetic material as viewed in the conveying direction is included in the first portion, and a trailing end of a portion of the sheet-like member containing the magnetic material as viewed in the conveying direction is included in the second portion.

4. A conveying apparatus that transports a plurality of sheet-like members each containing a magnetic material, comprising:

an endless belt on which the sheet-like members are placed; and a roller around which the endless belt is looped, the roller being configured to move and fold back the endless belt, the sheet-like members being successively released from the endless belt while the endless belt is moving along the roller, wherein the endless belt includes a first magnetic force generating portion configured to generate a first magnetic force, and a second magnetic force generating portion configured to generate a second magnetic force that is stronger than the first magnetic force, and wherein a first portion of each of the sheet-like members which contains the magnetic material is located in the first magnetic force generating portion, and a second portion of each of the sheet-like members which contains the magnetic material and is located reward of the first portion as viewed in a conveying direction of the sheet-like members is located in the second magnetic force generating portion.

* * * * *